(12) United States Patent
Chee et al.

(10) Patent No.: US 7,098,075 B1
(45) Date of Patent: Aug. 29, 2006

(54) INTEGRATED CIRCUIT AND METHOD OF PRODUCING A CARRIER WAFER FOR AN INTEGRATED CIRCUIT

(75) Inventors: Soon-Shin Chee, Sunnyvale, CA (US); Alelie Funcell, Milpitas, CA (US); Abhay Maheshwari, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/769,663

(22) Filed: Jan. 29, 2004

(51) Int. Cl.
H01L 21/44 (2006.01)
H01L 21/48 (2006.01)
H01L 21/50 (2006.01)

(52) U.S. Cl. .................... 438/108; 438/125
(58) Field of Classification Search ............. None
See application file for complete search history.

(56) References Cited

U.S. PATENT DOCUMENTS

| | | | |
|---|---|---|---|
| 5,760,478 A * | 6/1998 | Bozso et al. ............... 257/777 |
| 5,923,090 A * | 7/1999 | Fallon et al. .............. 257/777 |
| 5,946,553 A * | 8/1999 | Wood et al. ............... 438/108 |
| 6,204,074 B1 | 3/2001 | Bertolet et al. |
| 6,507,115 B1 * | 1/2003 | Hofstee et al. ............ 257/777 |
| 6,511,901 B1 | 1/2003 | Lam et al. |
| 6,528,408 B1 * | 3/2003 | Kinsman .................... 438/613 |
| 6,530,815 B1 * | 3/2003 | Bro et al. ................... 446/15 |
| 6,548,326 B1 * | 4/2003 | Kobayashi et al. ........ 438/108 |
| 6,558,977 B1 * | 5/2003 | Nakaoka et al. .......... 438/107 |
| 6,583,512 B1 * | 6/2003 | Nakaoka et al. .......... 257/777 |
| 6,638,789 B1 * | 10/2003 | Glenn et al. .............. 438/109 |
| 6,808,955 B1 * | 10/2004 | Ma ............................ 438/51 |
| 6,815,255 B1 * | 11/2004 | Nakaoka et al. .......... 438/108 |
| 6,835,593 B1 * | 12/2004 | Shibata ...................... 438/106 |

* cited by examiner

*Primary Examiner*—David A. Zarneke
(74) *Attorney, Agent, or Firm*—John J. King; Kim Kanzaki

(57) ABSTRACT

A method of producing a carrier wafer for an integrated circuit is disclosed. The method comprises the steps of providing a carrier wafer having a plurality of bump pads and a plurality of wire bond pads; providing a passivation layer on the carrier wafer; etching a passivation layer over at least a portion of the plurality of bump pads; applying solder bumps on the plurality of bump pads; and separately etching the passivation layer over at least a portion of the plurality of wire bond pads. An integrated circuit employing a flip chip is also disclosed.

15 Claims, 5 Drawing Sheets

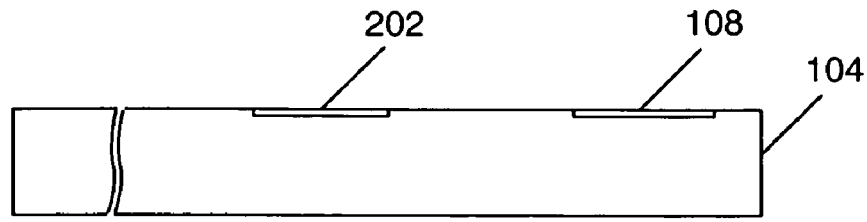
FIG. 3-A
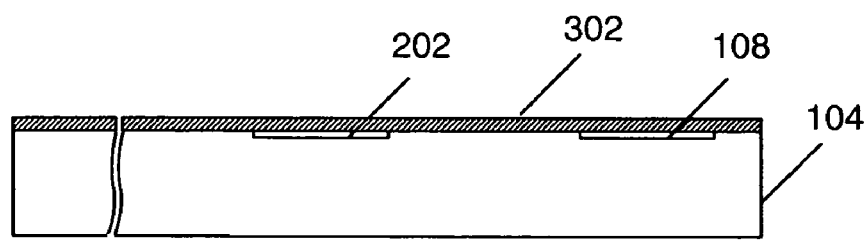
FIG. 3-B
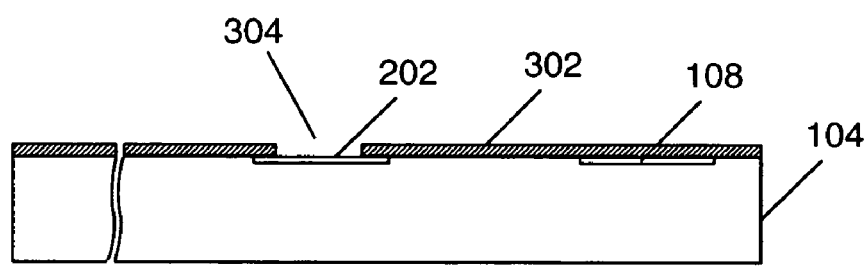
FIG. 3-C
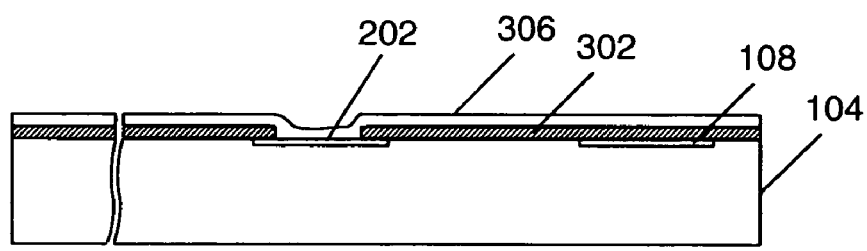
FIG. 3-D

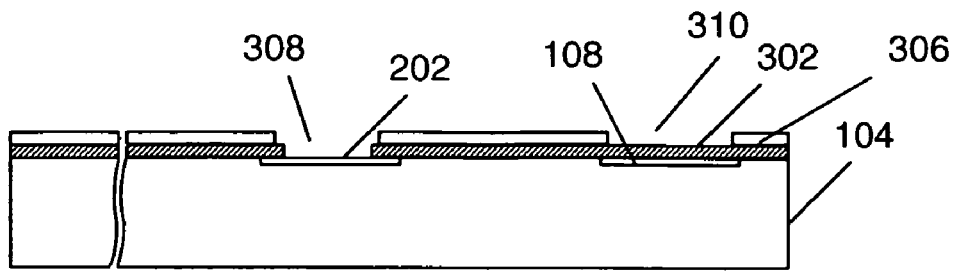
FIG. 3-E
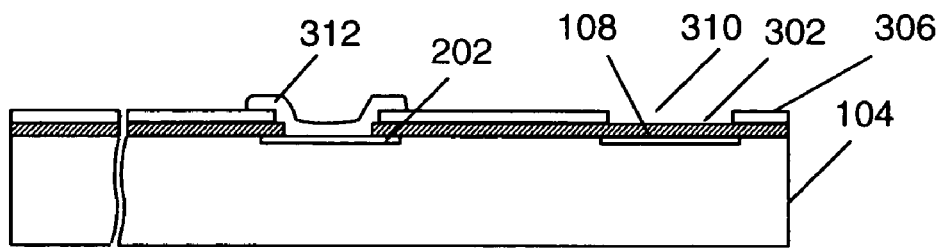
FIG. 3-F
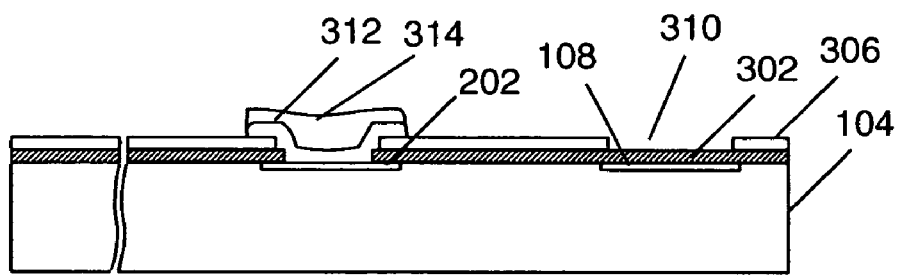
FIG. 3-G
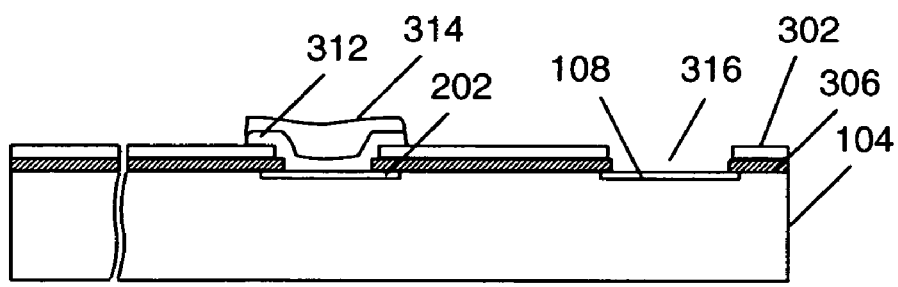
FIG. 3-H

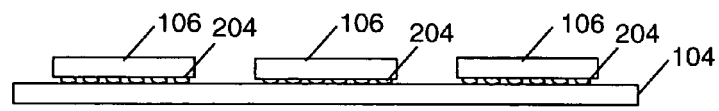
FIG. 4-A
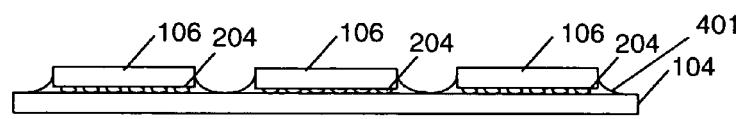
FIG. 4-B
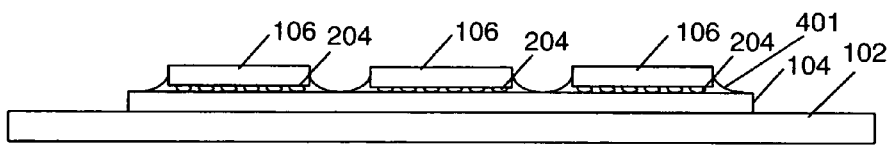
FIG. 4-C
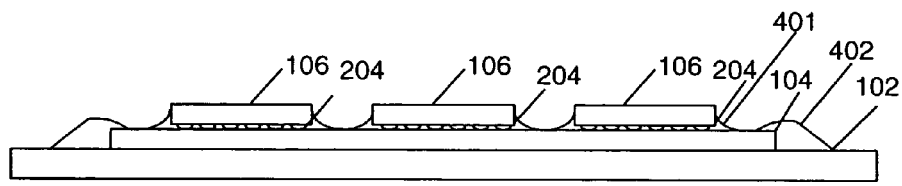
FIG. 4-D
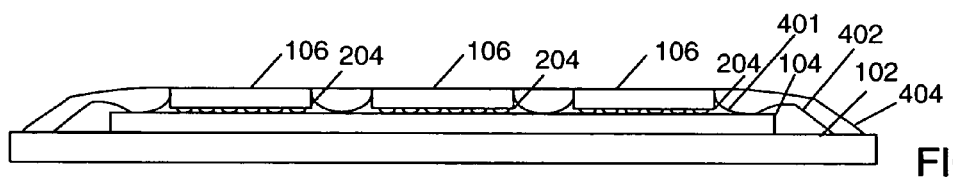
FIG. 4-E
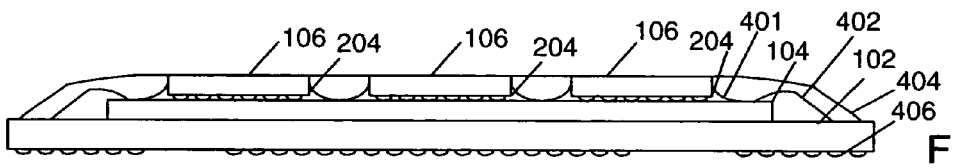
FIG. 4-F
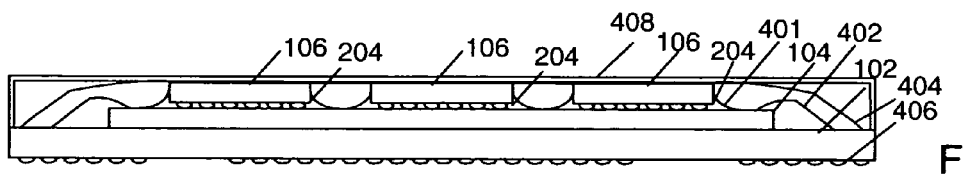
FIG. 4-G

INTEGRATED CIRCUIT AND METHOD OF PRODUCING A CARRIER WAFER FOR AN INTEGRATED CIRCUIT

FIELD OF THE INVENTION

The present invention relates generally to integrated circuits, and in particular, to a method of producing a carrier wafer for an integrated circuit.

BACKGROUND OF THE INVENTION

In manufacturing semiconductor devices, it is imperative that the devices are defect free at the time of production, and reliable throughout their use. When defects are found in completed devices, the percentage of usable devices increases, and the profitability of the manufacturer suffers. More importantly, when a semiconductor device fails after been installed a device, such a failure can cause the entire device to fail. That is, the failure of a single semiconductor device can render an entire consumer electronics device unusable. Accordingly, it is important that manufacturers of semiconductor devices minimize defects whenever possible.

One area where defects can occur as in the area of wire bonding. Wire bonds are used to connect a bond pad on one element of a device, such as a carrier wafer, to a bond pad on another element, such as a substrate receiving carrier wafer. Two types of wire bonding which are commonly used include ball bonding and wedge bonding. Gold-ball bonding is the most popular method. In this process, a melted sphere of gold bonds a length of wire down as a first bond. A loop drawn out from the first bond then connects the wire, and then reforms another ball for the subsequent ball bond. Gold-wire bonding is characterized as a thermosonic process, meaning that heat, ultrasonics, force, and time are all used to effect the bond. A second method of wire bonding is the wedge bonding process. This process is primarily used with aluminum wire but also can be used with gold wire. Usually performed at an ambient temperature, wedge bonding involves putting two wedge bonds down. No ball is formed in this process. This aluminum bond process is characterized as an ultrasonic wire bond, meaning only ultrasonic energy, force, and time are used to create the bond.

The use of these types of processes depends on the specific type of application. For example, gold-wire bonding is used in most high volume applications because it is a faster process. Aluminum-wire bonding is used in situations when packages or a PCB cannot be heated. In addition, the wedge bonding process can attain a finer pitch than gold-wire bonding. Gold-wire bonding, for example, requires smooth, clean bond surfaces. Typically, gold wire is bonded to an aluminum pad on the die and thick-or thin-film gold metallization on the substrate. The cleanliness of the substrate affects the reliability of the bond. Although organic contamination can be removed with a cleaning process, such as argon plasma cleaning, such removal requires additional time and expense.

When producing a carrier wafer having bond pads, a number of processing steps are performed before a wire bond is ever attached to the bond pad of the wafer carrier. In some instances, for example when a flip chip is attached to the carrier wafer, a bump pad on a carrier wafer for receiving a solder bump is formed at the same time that a wire bond pad is formed. While various steps for enabling a flip chip to be attached to the carrier wafer are performed on the bond pad, such as the application of an under bump metallization layer and the solder bump itself, the wire bond pad on the carrier wafer remains exposed. That is, the surface of the wire bond pad is often exposed to processing steps for other areas of the carrier wafer. Accordingly, the wire bond pad can often become contaminated, rendering the wire bond pad difficult to bond.

Accordingly, there is a need for an improved integrated circuit and method of producing an integrated circuit integrated circuit having improved wire bond pads.

SUMMARY OF THE INVENTION

A method of producing a carrier wafer for an integrated circuit is disclosed. The method preferably provides a carrier wafer having a plurality of bump pads and a plurality of wire bond pads. A passivation layer is provided on the carrier wafer, and then etched over a portion of the plurality of bump pads. Solder bumps and other metallization layers are then applied on the bump pads. The passivation layer over at least a portion of the plurality of wire bond pads is then separately. By providing the separate etching step, the wire bond pads remain uncontaminated, thereby providing a better surface for a wire bond. A method of assembling a carrier wafer having one or more flip chips and a method of assembling a multi-chip modules are also described.

An integrated circuit employing a carrier wafer is also disclosed. The integrated circuit preferably comprises a carrier wafer having a plurality of bump pads and a plurality of wire bond pads. A passivation layer is also formed on the carrier wafer over the plurality of bump pads and the plurality of wire bond pads. A solder bump is provided on a bump pad within a first etched window formed in a first etching step in the passivation layer. A second etched window is also provided over at least a portion of the wire bond pad. The second etched window is formed in the passivation layer by a second etching step. Accordingly, the wire bond pads remain uncontaminated, and provide a better surface for a wire bond.

A completed carrier wafer and a fully assembled multi-chip module employing a plurality of flip chips including a carrier wafer processed according to the present invention are also disclosed.

BRIEF DESCRIPTION OF THE DRAWINGS

FIGS. 3A–3H is a series of cross sectional views showing the formation of a carrier wafer according to an embodiment of the present invention;

FIGS. 4A–4G is a series of cross sectional views showing the formation of a multi-chip module according to an embodiment of the present invention;

DETAILED DESCRIPTION OF THE DRAWINGS

Figure 1:
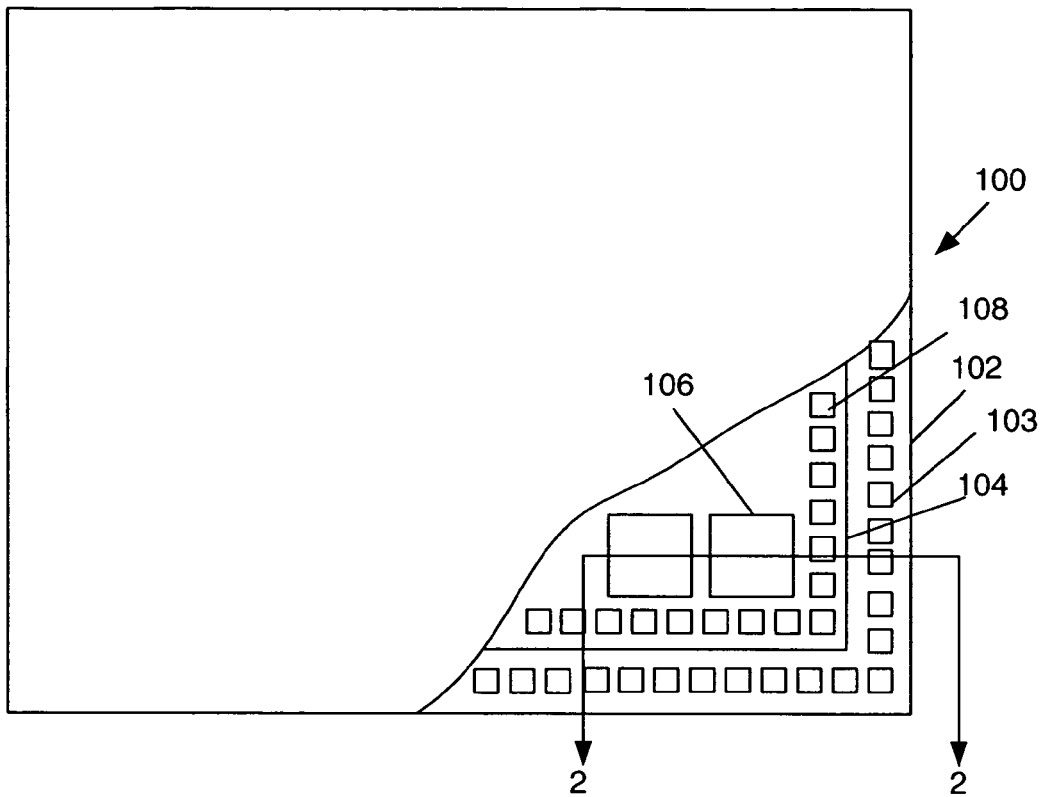
FIG. 1 is a top plan view of a multi-chip module according to an embodiment of the present invention.
Figure 2:
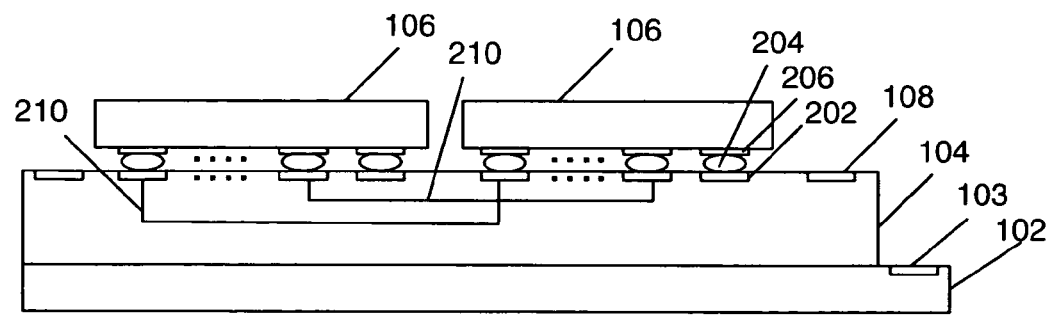
FIG. 2 is a cross sectional view of the multi-chip module of FIG. 1 taken at lines 2—2 according to an embodiment of the present invention.

Turning first to FIGS. 1 and 2, a multi-chip module according to an embodiment of the present invention is shown. In particular, integrated circuit 100 comprises a substrate 102 having a plurality of wire bond pads 103. A carrier wafer 104 is coupled to the integrated circuit 100, as is shown in more detail in reference to the cross-section of FIG. 2. A plurality of flip chips 106 are positioned on the carrier wafer 104. The carrier wafer 104 could be for example, a silicon carrier wafer, or some other suitable material. Bump pads 202 on the carrier wafer enable coupling the flip chips 106 to the substrate 102. The substrate 102 could be a ceramic substrate, or some other organic substrate. Solder bumps 204 enable a connection to contact pads 206. Finally, lines 210 generally enable the coupling of the two or more flip chips, and in particular, the coupling of regions of the flip chip employing programmable logic. Such coupling of programmable logic in flip chips is described in more detail in U.S. application Ser. No. 10/624, 832 Entitled "A Programmable Multi-Chip Module," filed on Jul. 21, 2003 and assigned to the assignee of the present invention, the entire application of which is incorporated herein by reference.

Turning now to FIGS. 3A–3H, a series of cross sectional views shows the formation of a carrier wafer according to an embodiment of the present invention. The carrier wafer 104 comprises a plurality of wire bond pads 108 and a plurality of bump pads 202 as shown in FIG. 3-A. The carrier wafer can be a silicon die, for example, or some other suitable material. The bump pads and the wire bond pads are preferably formed by a metallization process, but could be formed by another suitable process, such as diffusion techniques. The carrier wafer preferably has interconnecting traces, such as lines 210 of FIG. 2, also formed by metallization or some other technique, and may include passive elements, such as resistors, inductors or capacitors.

A passivation layer 302 is then applied, as shown in FIG. 3-B. The passivation layer is then etched to form an etched window exposing the bump pad 202, as shown in FIG. 3-C. However, it should be noted that the wire bond pad 108 remains unetched. Accordingly, the wire bond pads remain clean during remaining steps of the semiconductor manufacturing process, such as the application of an under bump metallization (UBM) layer and a solder bump.

A dielectric layer 306 is then applied over the passivation layer 302, as shown in FIG. 3-D. The dielectric layer 306 is then etched to again expose bump pad 202 through etched window 308 and create an etched window 310. The passivation layer 306 still remains over the wire bond pad 302, as shown in FIG. 3-E. Metallization steps can then be performed without contaminating the wire bond pad 108. In particular, an under bump metallization layer 312 can be applied as shown in FIG. 3-F, while a solder bump 314 can be applied as shown in FIG. 3-G. However, no materials from the metallization steps can be deposited on the wire bond pad 108.

Photoresist is then applied over the carrier wafer and the windows are etched for the intended wire bond areas. A dry or wet etch process can then be used to remove the passivation over the wire bond pads, as shown in FIG. 3-H. After the wire bond openings are formed, the resist is stripped off using either a wet or dry etching process leaving opening 316. The silicon wafer is then sent for further flip chip assembly processing as shown in FIG. 4.

Turning now to FIGS. 4A–4G, a series of cross sectional views shows the formation of a multi-chip module according to an embodiment of the present invention. In particular, a plurality of flip chips 106 is attached to a carrier wafer 104 as shown in FIG. 4A. An underfill layer 401 is then applied as shown in FIG. 4B. The carrier wafer 104 is then coupled to a substrate 102 as shown in FIG. 4C. Wire bonds 402 are then made between the wire bond pads 108 of the carrier wafer 104 and the wire bond pads 103 of the substrate 102, as shown in FIG. 4D. An encapsulation layer 404 is then applied over the flip chips 106 and the wire bonds 402 as shown in FIG. 4E. In addition to providing protection for the wire bonds, the encapsulation layer can also provide heat conductive qualities to improve the heat dissipation in the device. Solder balls 406 are then applied to the bottom of the substrate as shown in FIG. 4F. The solder bumps 406 enable the attachment of the multi-chip module to a circuit board for use in a device, such as a consumer electronics device. Finally, a metal lid 408 or some other suitable cover is applied over the substrate to enclose the encapsulation layer and the wire bonds, as shown in FIG. 4-G.

Figure 5:
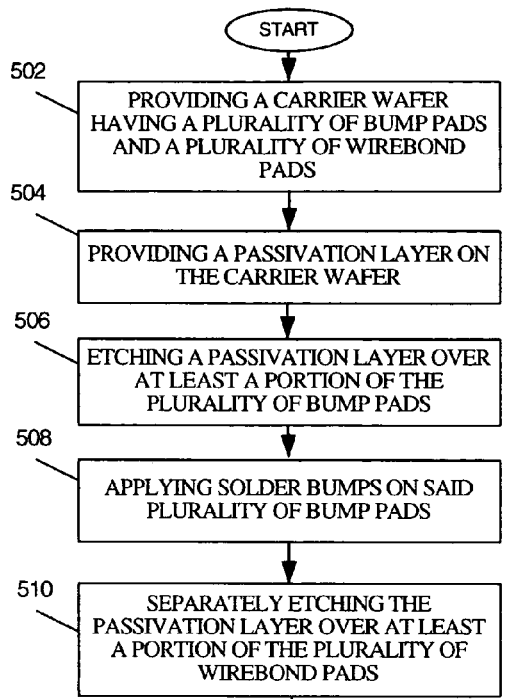
FIG. 5 is a flow chart showing a method of forming a carrier wafer according to an embodiment of the present invention.

Turning now to FIG. 5, a flow chart shows a method of forming a carrier wafer according to an embodiment of the present invention. The method preferably comprises a step of providing a carrier wafer having a plurality of bump pads and a plurality of wire bond pads at a step 502. A suitable carrier wafer could be a silicon carrier wafer. A passivation layer is then applied to the carrier wafer at a step 504. The passivation layer over at least a portion of the plurality of bump pads is then etched at a step 506. It should be noted however that the passivation layer is not etched over wire bond pads of the carrier wafer. Solder bumps and any other metallization, such as an under bump metallization, are then applied on the plurality of bump pads at a step 508. Finally, the passivation layer over at least a portion of the plurality of wire bond pads is then separately etched over the wire bond pads at a step 510. Because the etching step of the wire bond pads is performed after the metallization or other processing steps, the wire bond pads are not contaminated, thereby improving the quality of the wire bond between the wire bond pad and some other contact, such as a wire bond pad on a substrate.

Figure 6:
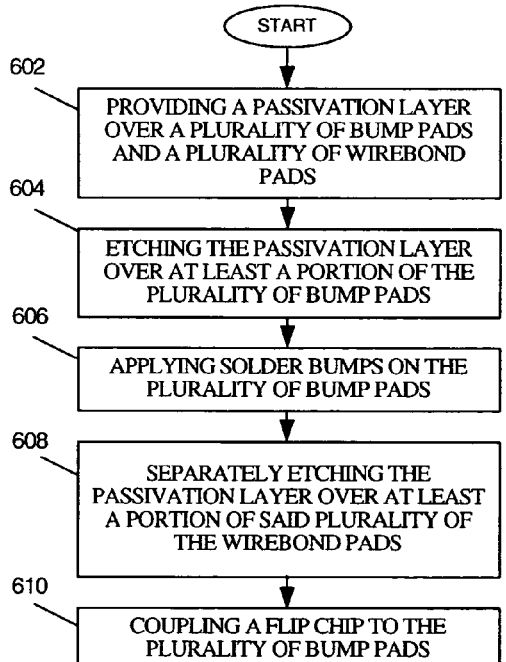
FIG. 6 is a flow chart showing a method of assembling a carrier wafer according to an embodiment of the present invention.

Turning now to FIG. 6, a flow chart shows a method of assembling a carrier wafer according to an embodiment of the present invention. The method enables employing a flip chip in an integrated circuit, and preferably comprises a step of providing a passivation layer over a plurality of bump pads and a plurality of wire bond pads formed on a carrier wafer at a step 602. The passivation layer over at least a portion of the plurality of bump pads is then etched at a step 604. Solder bumps and any underbump metallization are the applied on the plurality of bump pads at a step 606. The passivation layer over at least a portion of the plurality of the wire bond pads is then separately etched at a step 608. A flip chip is then coupled to the plurality of bump pads at a step 610.

Figure 7:
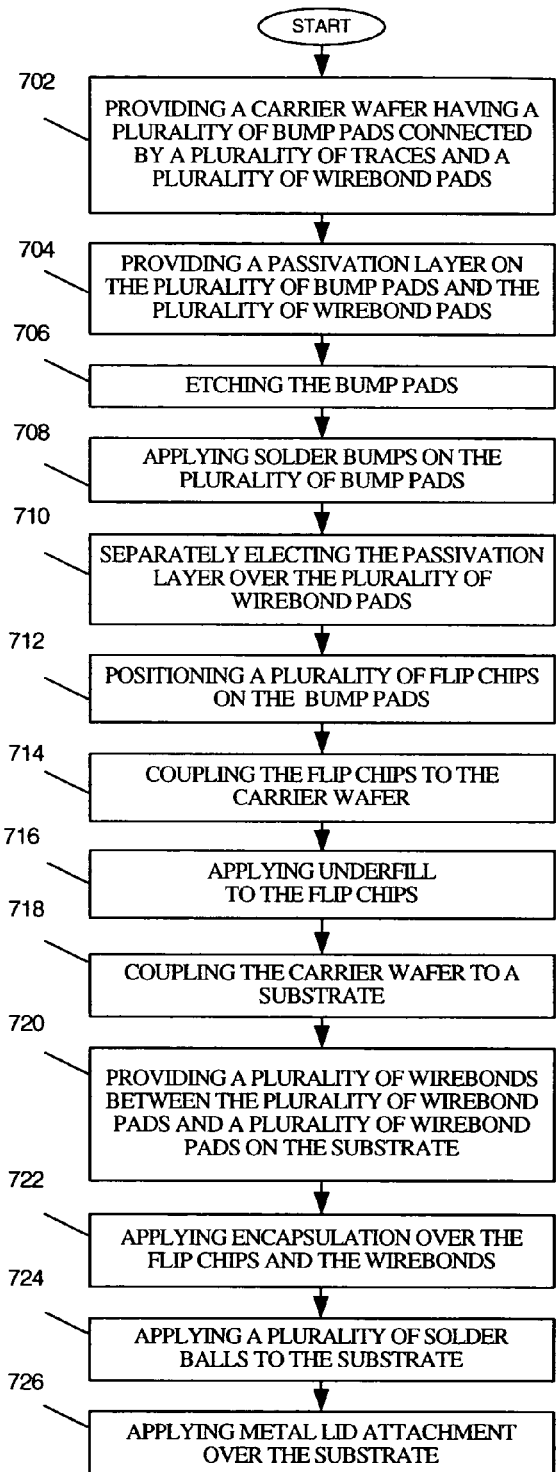
FIG. 7 is a flow chart showing a method of assembling a multi-chip module according to an embodiment of the present invention.

Turning now to FIG. 7, a flow chart shows a method of assembling a multi-chip module according to an embodiment of the present invention. The method employs a plurality of flip chips in an integrated circuit, and preferably comprises the steps of providing a silicon carrier wafer having a plurality of bump pads connected by a plurality of traces and a plurality of wire bond pads at a step 702. A passivation layer is then provided on the plurality of bump pads and the plurality of wire bond pads at a step 704. The passivation layer over the plurality of bump pads is then etched at step 706. The solder bumps and any other metallization layer are then applied on the plurality of bump pads at a step 708. The passivation layer over the plurality of wire bond pads is then separately etched at a step 710. A plurality of flip chips is then positioned on the plurality of bump pads at a step 712. The flip chips are applied to the carrier wafer at a step 714 and underfill is applied at a step 716. The carrier wafer is then coupled to a substrate at a step 718. A plurality of wire bonds are then provided between the plurality of wire bond pads on the carrier wafer and a plurality of wire bond pads on the substrate at a step 720. An encapsulation layer is applied over the flip chips and the plurality of wire bonds at a step 722. A plurality of solder balls is then applied to the substrate at a step 724. Finally, a metal lid or some other suitable cover is then attached over the substrate at a step 726.

It can therefore be appreciated that the new and novel integrated circuit and method of employing a flip chip in an integrated circuit has been described. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

The invention claimed is:

1. A method of producing a carrier wafer for an integrated circuit, said method comprising the steps of:
   providing a carrier wafer having a plurality of bump pads and a plurality of wire bond pads;
   providing a passivation layer on said carrier wafer;
   etching a passivation layer over at least a portion of said plurality of bump pads;
   applying solder bumps on said plurality of bump pads; and
   separately etching the passivation layer over at least a portion of said plurality of wire bond pads.

2. The method of claim 1 wherein said step of providing a carrier wafer comprises a step of providing a carrier wafer having traces connecting at least a portion of said plurality of bump pads.

3. The method of claim 2 further comprising a step of coupling a flip chip to said carrier wafer.

4. The method of claim 3 wherein said step of coupling said flip chip to said carrier wafer comprises a step of coupling said flip chip to another flip chip by way of said traces on said substrate.

5. The method of claim 1 further comprising a step of providing wire bonds between said plurality of wire bond pads and a plurality of wire bond pads on a substrate.

6. A method of producing a carrier wafer for an integrated circuit, said method comprising the steps of:
   providing a passivation layer over a plurality of bump pads and a plurality of wire bond pads formed on a carrier wafer;
   etching said passivation layer over at least a portion of said plurality of bump pads;
   applying solder bumps on said plurality of bump pads;
   separately etching the passivation layer over at least a portion of said plurality of said wire bond pads; and
   coupling a flip chip to said plurality of bump pads.

7. The method of claim 6 further comprising a step of providing traces connecting at least some of said plurality of bump pads on said carrier wafer.

8. The method of claim 7 wherein said step of coupling a flip chip to said plurality of bump pads comprises a step of coupling said flip chip to another flip chip by way of said traces.

9. The method of claim 8 further comprising a step of connecting programmable logic of said flip chip to programmable logic of said other flip chip.

10. The method of claim 6 further comprising a step of providing a wire bond between said plurality of wire bond pads and a plurality of wire bond pads on a substrate.

11. A method of producing a carrier wafer for an integrated circuit, said method comprising the steps of:
   providing a silicon carrier wafer having a plurality of bump pads connected by a plurality of traces, and a plurality of wire bond pads;
   providing a passivation layer over said plurality of bump pads and said plurality of wire bond pads;
   etching said passivation layer over said plurality of bump pads;
   applying solder bumps on said plurality of bump pads;
   separately electing said passivation layer over said plurality of wire bond pads; and
   coupling a plurality of flip chips to said plurality of bump pads.

12. The method of claim 11 comprising a step of connecting a region of a first flip chip to a region of a second flip chip.

13. The method of claim 12 wherein said step of connecting a region of a first flip chip to a region of a second flip chip comprises a step of connecting programmable logic of said first flip chip and said second flip chip.

14. The method of claim 11 further comprising a step of providing a wire bond between a wire bond pad of said plurality of wire bond pads and a wire bond pad of a substrate.

15. A method of producing a carrier wafer for an integrated circuit, said method comprising the steps of:
   providing a silicon carrier wafer having a plurality of bump pads connected by a plurality of traces and a plurality of wire bond pads;
   providing a passivation layer on said plurality of bump pads and said plurality of wire bond pads;
   etching said plurality of bump pads;
   applying solder bumps on said plurality of bump pads;
   separately electing said passivation layer over said plurality of wire bond pads after applying said solder bumps;
   positioning a plurality of flip chips on said plurality of bump pads;
   coupling said carrier wafer to a substrate;
   providing a plurality of wire bonds between said plurality of wire bond pads and a plurality of wire bond pads on said substrate;
   applying an encapsulation layer over said flip chips and said plurality of wire bonds;
   applying a plurality of solder balls to said substrate; and
   attaching a metal lid over said substrate.

* * * * *